(12) United States Patent
Scanlan

(10) Patent No.: US 9,761,571 B2
(45) Date of Patent: Sep. 12, 2017

(54) THERMALLY ENHANCED FULLY MOLDED FAN-OUT MODULE

(71) Applicant: DECA Technologies Inc., Tempe, AZ (US)

(72) Inventor: Christopher M. Scanlan, Chandler, AZ (US)

(73) Assignee: DECA Technologies Inc., Tempe, AZ (US)

( * ) Notice: Subject to any disclaimer, the term of this patent is extended or adjusted under 35 U.S.C. 154(b) by 0 days.

(21) Appl. No.: 15/268,345

(22) Filed: Sep. 16, 2016

(65) Prior Publication Data

US 2017/0084596 A1 Mar. 23, 2017

Related U.S. Application Data

(60) Provisional application No. 62/219,991, filed on Sep. 17, 2015.

(51) Int. Cl.

| | |
|---|---|
| *H01L 25/00* | (2006.01) |
| *H01L 21/48* | (2006.01) |
| *H01L 25/065* | (2006.01) |
| *H01L 23/367* | (2006.01) |
| *H01L 23/31* | (2006.01) |
| *H01L 23/00* | (2006.01) |

(Continued)

(52) U.S. Cl.
CPC .......... *H01L 25/50* (2013.01); *H01L 21/4853* (2013.01); *H01L 21/4882* (2013.01); *H01L 21/561* (2013.01); *H01L 21/6835* (2013.01); *H01L 23/3128* (2013.01); *H01L 23/3675* (2013.01); *H01L 24/09* (2013.01); *H01L 25/0655* (2013.01); *H01L 2221/68354* (2013.01); *H01L 2221/68359* (2013.01); *H01L 2924/15174* (2013.01)

(58) Field of Classification Search
CPC ... H01L 23/3114; H01L 23/552; H01L 21/50; H01L 21/78; H01L 25/0652; H01L 25/0657; H01L 24/19; H01L 24/94
USPC ......... 438/109, 123, 113; 257/686, E21.599, 257/E25.013, E21.506, E21.499, E23.141
See application file for complete search history.

(56) References Cited

U.S. PATENT DOCUMENTS

| | | |
|---|---|---|
| 4,970,577 A | 11/1990 | Ogihara et al. |
| 2012/0068328 A1 | 3/2012 | Chen et al. |

(Continued)

*Primary Examiner* — Evan Pert
*Assistant Examiner* — Changhyun Yi
(74) *Attorney, Agent, or Firm* — Booth Udall Fuller, PLC

(57) ABSTRACT

A method of making a semiconductor device can include providing a temporary carrier with adhesive. A first semiconductor die and a second semiconductor die can be mounted face up to the temporary carrier such that back surfaces of the first semiconductor die and the second semiconductor die are depressed within the adhesive. An embedded die panel can be formed by encapsulating at least four sides surfaces and an active surface of the first semiconductor die, the second semiconductor die, and side surfaces of the conductive interconnects in a single step. The conductive interconnects of the first semiconductor die and the second semiconductor die can be interconnected without a silicon interposer by forming a fine-pitch build-up interconnect structure over the embedded die panel to form at least one molded core unit. The at least one molded core unit can be mounted to an organic multi-layer substrate.

20 Claims, 12 Drawing Sheets

(51) Int. Cl.
*H01L 21/683* (2006.01)
*H01L 21/56* (2006.01)

(56) References Cited

U.S. PATENT DOCUMENTS

| | | | |
|---|---|---|---|
| 2012/0074587 A1* | 3/2012 | Koo | H01L 21/561 |
| | | | 257/774 |
| 2013/0168849 A1 | 7/2013 | Scanlan | |
| 2013/0228917 A1* | 9/2013 | Yoon | H01L 23/49811 |
| | | | 257/737 |
| 2013/0280826 A1 | 10/2013 | Scanlan | |
| 2016/0225742 A1* | 8/2016 | Davis | H01L 25/0655 |
| 2016/0276307 A1* | 9/2016 | Lin | H01L 21/561 |

* cited by examiner

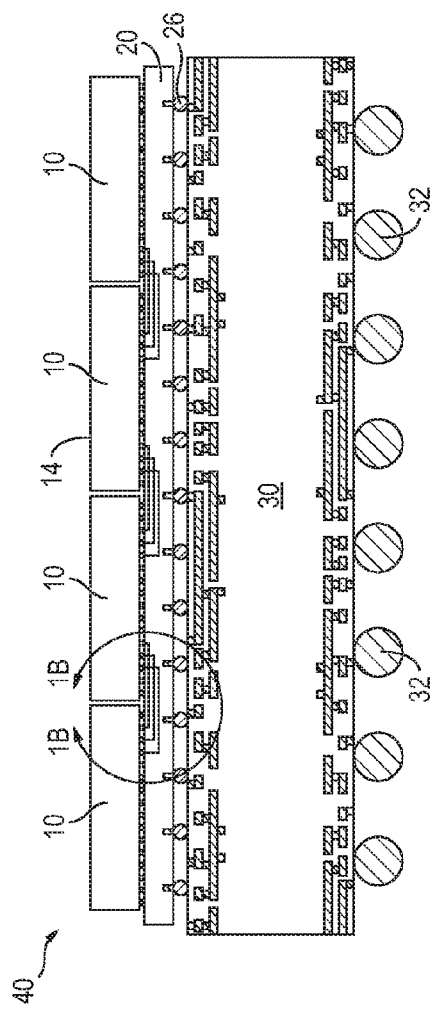
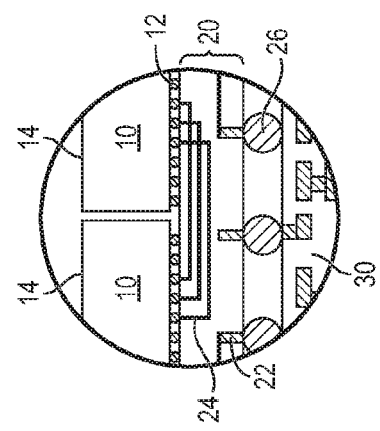
FIG. 1A (PRIOR ART)
FIG. 1B (PRIOR ART)

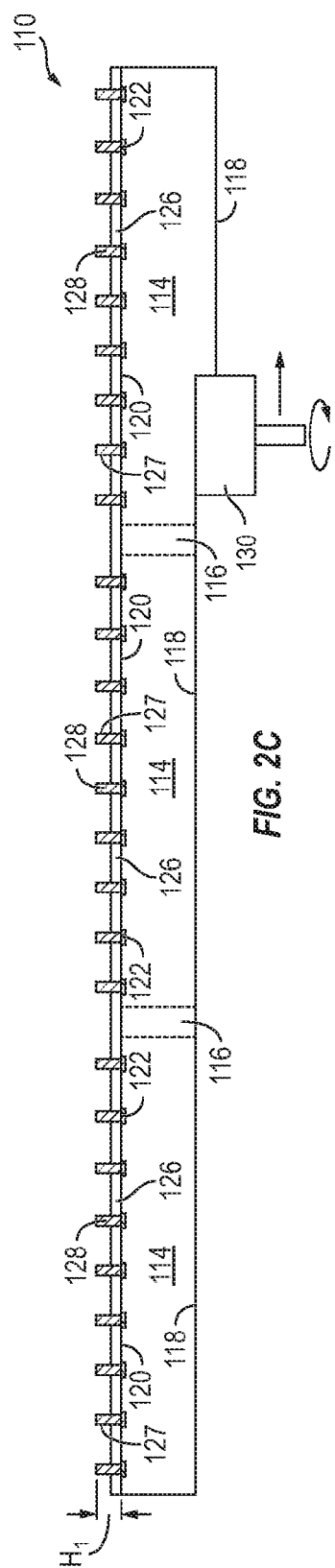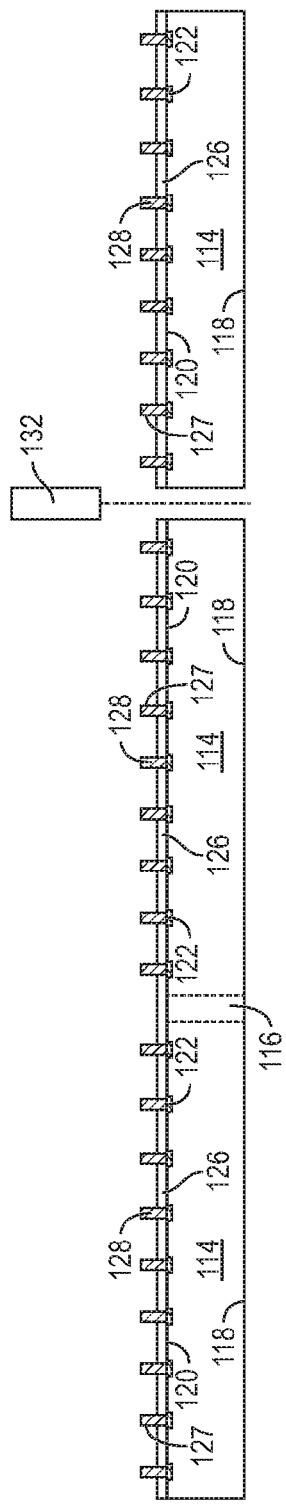

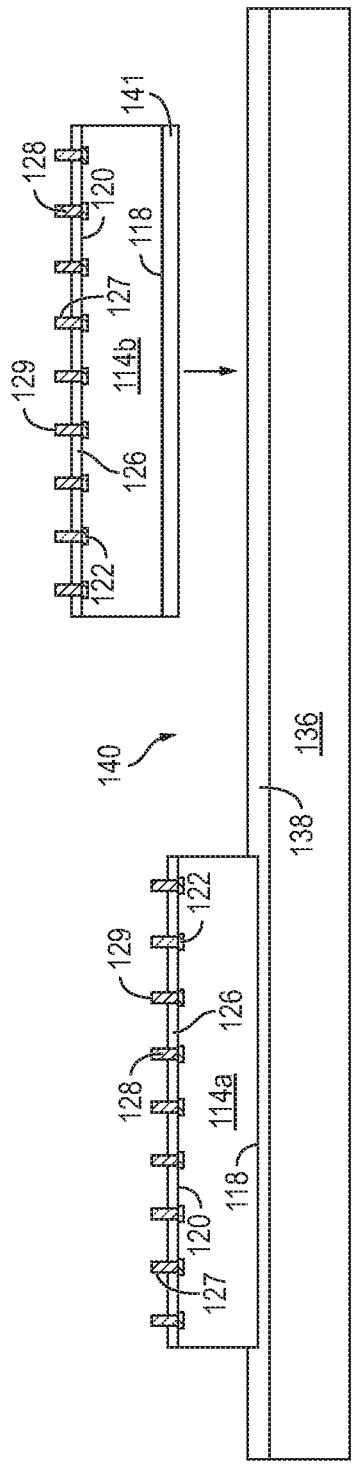
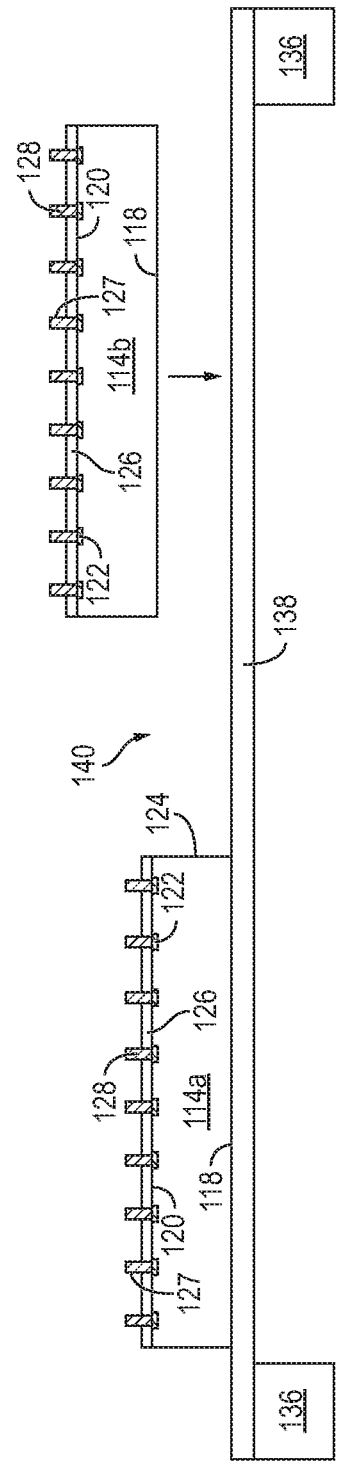

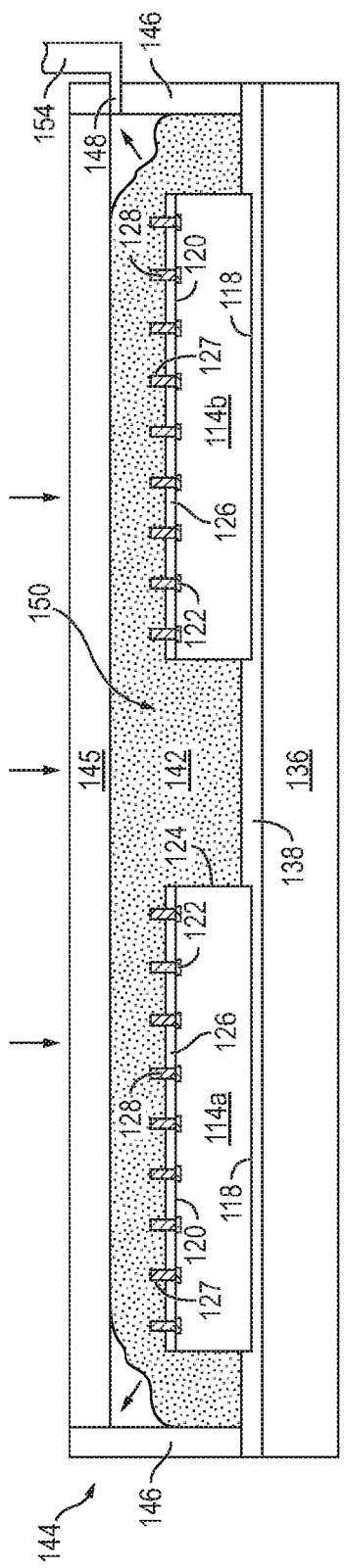
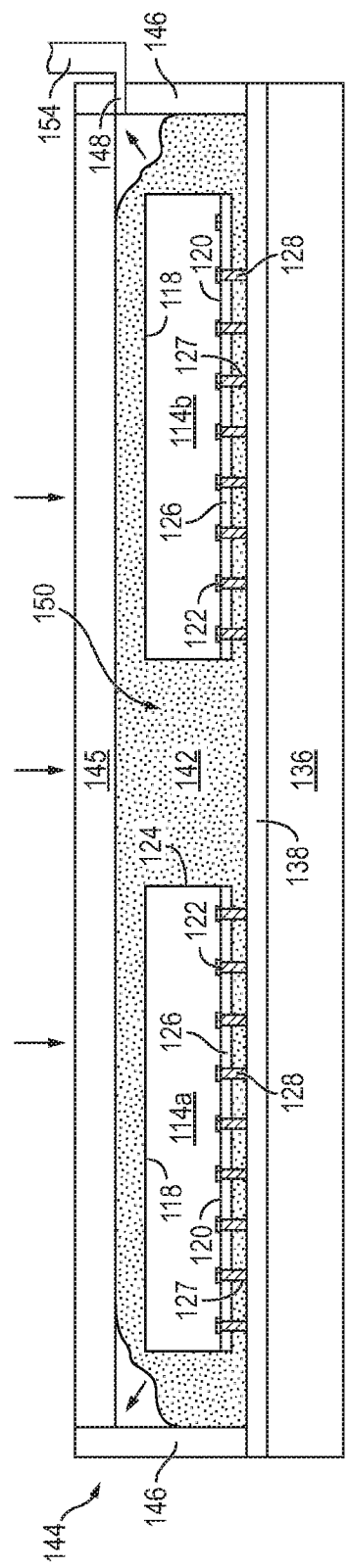
FIG. 3C
FIG. 3D

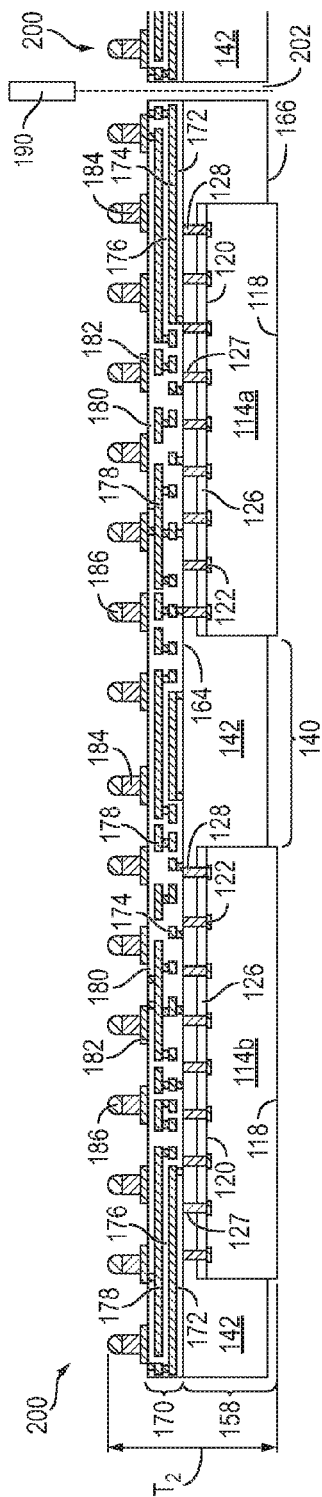
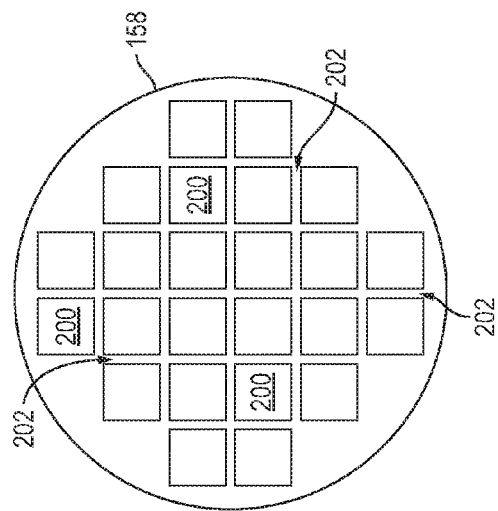
FIG. 3G
FIG. 3H

THERMALLY ENHANCED FULLY MOLDED FAN-OUT MODULE

CROSS-REFERENCE TO RELATED APPLICATIONS

This application claims the benefit, including the filing date, of U.S. Provisional Patent No. 62/219,991, entitled "Thermally Enhanced Fully Molded Fan-Out Module," which was filed on Sep. 17, 2015, the disclosure of which is hereby incorporated herein by this reference.

TECHNICAL FIELD

The disclosure relates to semiconductor packaging comprising thermally enhanced fan-out modules and methods of making the same.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A method for integration of multiple semiconductor die or chips 10 with high routing density and high thermal dissipation is to flip-chip attach the semiconductor die 10 with microbumps, bumps, or balls 12 to a silicon (Si) interposer 20 and to further flip-chip attach the Si interposer 12 to a package or multi-layer, organic ball grid array (BGA) substrate 30 to form a semiconductor package 40 with Si interposer 20. The chips 10 can be individual semiconductor die or strips or slices of die, including a 28 nm field-programmable gate array (FPGA) die slices. The Si interposer 20 provides the high density routing between the multiple chips 10. Through Si Vias (TSVs) 22 are formed in the Si interposer 20 to route electrical signals through routing layers or redistribution layers (RDLs) 24 and the TSVs 22 to an array of flip-chip bumps or C4 bumps 26 on the bottom of the interposer. The routing layers 24 are high bandwidth, low-latency connections. Signals in and out of the package substrate 30 can be routed through the flip-chip bumps 26 and the ball grid array (BGA) bumps or solder balls 32. After assembly of the package 40 to a motherboard, a heat sink can be attached to the package 40, such as at the back surfaces 14 of the chips 10.

SUMMARY

An opportunity exists for improved semiconductor manufacturing. Accordingly, in an aspect, a method of making a fully molded fan-out module (FMFOM) can comprise providing a temporary carrier comprising an adhesive disposed over a top surface of the temporary carrier, providing a first semiconductor die comprising conductive interconnects coupled to an active surface of the first semiconductor die, and providing a second semiconductor die comprising conductive interconnects coupled to an active surface of the second semiconductor die. The first semiconductor die and the second semiconductor die can be mounted face up to the temporary carrier such that back surfaces of the first semiconductor die and the second semiconductor die are depressed within the adhesive before encapsulating the first semiconductor die and the second semiconductor die. An embedded die panel can be formed by encapsulating at least four side surfaces and an active surface of the first semiconductor die, the second semiconductor die, and side surfaces of the conductive interconnects with encapsulant in a single step. The conductive interconnects of the first semiconductor die and the second semiconductor die can be interconnected without a silicon interposer by forming a fine-pitch build-up interconnect structure over the embedded die panel to form at least one molded core unit. The temporary carrier can be removed. The at least one molded core unit can be mounted to an organic multi-layer substrate. A heat sink can be coupled to the molded core unit with a thermal interface material (TIM) disposed between the heat sink and the molded core unit.

The method of making the FMFOM can further comprise removing the first semiconductor die and the second semiconductor die from the adhesive after encapsulating the first semiconductor die and the second semiconductor die to expose the back surfaces of the first semiconductor die and the second semiconductor die. The back surfaces of the first semiconductor die and the second semiconductor die are offset from the encapsulant by a distance greater than 10 μm. The TIM can be provided over the offset back surfaces of the first semiconductor die and the second semiconductor die, and the heat sink can be coupled to the molded core unit with the TIM disposed between the heat sink and the molded core unit. The conductive interconnects can be formed as copper studs and further comprise a height of 10-100 μm, and be solder free. The fine-pitch build-up interconnect structure can directly contact the conductive interconnects. The fine-pitch build-up interconnect structure can comprise line and space distance of less than 3 μm. Electrical connectivity of the at least one molded core unit can be tested before mounting the at least one molded core unit to the organic multi-layer substrate.

In another aspect, a method of making a FMFOM can comprise providing a temporary carrier comprising an adhesive disposed over a top surface of the temporary carrier. A first semiconductor die and a second semiconductor die can be mounted face up to the temporary carrier such that back surfaces of the first semiconductor die and the second semiconductor die are depressed within the adhesive before encapsulating the first semiconductor die and the second semiconductor die. An embedded die panel can be formed by encapsulating at least four sides surfaces and an active surface of the first semiconductor die, the second semiconductor die, and side surfaces of conductive interconnects coupled to the first and second semiconductor die in a single step. The conductive interconnects of the first semiconductor die and the second semiconductor die can be interconnected without a silicon interposer by forming a fine-pitch build-up interconnect structure over the embedded die panel to form at least one molded core unit. The temporary carrier can be removed and the at least one molded core unit can be mounted to a multi-layer substrate.

The method of making the FMFOM can further comprise mounting the first semiconductor die and the second semiconductor die face up to the carrier before encapsulating the first semiconductor die and the second semiconductor die, and removing the first semiconductor die and the second semiconductor die from the carrier after encapsulating the first semiconductor die and the second semiconductor die to expose the back surfaces of the first semiconductor die and the second semiconductor die. The back surfaces of the first semiconductor die and the second semiconductor die can be offset from the encapsulant by a distance greater than 10 μm. A TIM can be provided over the offset back surfaces of the first semiconductor die and the second semiconductor die, and a heat sink can be coupled to the molded core unit with the TIM disposed between the heat sink and the molded core unit. The fine-pitch build-up interconnect structure can directly contact the conductive interconnects. The fine-pitch build-up interconnect structure can comprise a line and space distance of less than 3 μm. The multi-layer substrate can be formed as a high density build-up (HDBU) substrate wherein the coefficient of thermal expansion (CTE) of the core unit is within 40% of the CTE of the HDBU substrate. The embedded die panel can be planarized to provide a coplanarity of less than or equal to 10 μm onto which the fine-pitch build-up interconnect structure is formed.

In another aspect, a method of making a FMFOM can comprise providing a first semiconductor die and second semiconductor die with conductive interconnects. An embedded die panel can be formed by encapsulating at least four sides surfaces and an active surface of the first semiconductor die, the second semiconductor die, and side surfaces of the conductive interconnects in a single step. The conductive interconnects of the first semiconductor die and the second semiconductor die can be interconnected without a silicon interposer by forming a fine-pitch build-up interconnect structure over the embedded die panel to form at least one molded core unit. The at least one molded core unit can be mounted to a multi-layer substrate.

The method of making the FMFOM can further comprise providing a temporary carrier comprising an adhesive disposed over a top surface of the temporary carrier, mounting the first semiconductor die and the second semiconductor die face up to the temporary carrier such that back surfaces of the first semiconductor die and the second semiconductor die are depressed within the adhesive before encapsulating the first semiconductor die and the second semiconductor die, and removing the first semiconductor die and the second semiconductor die from the carrier after encapsulating the first semiconductor die and the second semiconductor die to expose the back surfaces of the first semiconductor die and the second semiconductor die. The back surfaces of the first semiconductor die and the second semiconductor die can be offset from the encapsulant by a distance greater than 10 μm. A TIM can be provided over the offset back surfaces of the first semiconductor die and the second semiconductor die, and a heat sink can be coupled to the molded core unit with the TIM disposed between the heat sink and the molded core unit. Electrical connectivity of the at least one molded core unit can be tested before mounting the at least one molded core unit to the multi-layer substrate. The multi-layer substrate can be formed as a HDBU substrate, and the molded core unit can be mounted to the HDBU substrate with flip-chip bumps comprising bump coplanarity of less than or equal to 15 microns. After forming the fine-pitch build-up interconnect structure the embedded die panel can be singulated to form a plurality of molded core units that include the at least one molded core unit.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

FIGS. 1A and 1B illustrate a semiconductor package with a silicon interposer as known in the prior art.

FIGS. 2A-2D illustrate an aspect processing of semiconductor die from a native wafer.

FIGS. 3A-3K illustrate an aspect of formation of a FMFOM.

DETAILED DESCRIPTION

Figure 2A:
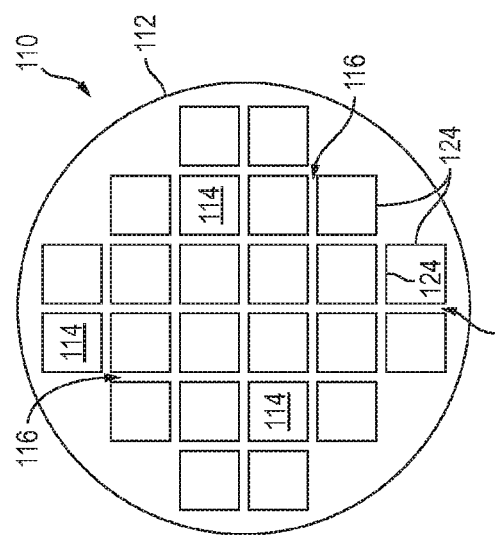

The present disclosure includes one or more aspects or embodiments in the following description with reference to the figures, in which like numerals represent the same or similar elements. Those skilled in the art will appreciate that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGs. are illustrative representations and are not necessarily drawn to scale.

This disclosure, its aspects and implementations, are not limited to the specific equipment, material types, or other system component examples, or methods disclosed herein. Many additional components, manufacturing and assembly procedures known in the art consistent with manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

Where the following examples, embodiments and implementations reference examples, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface can be beneficial or required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. Alternatively, mechanical abrasion without the use of corrosive chemicals is used for planarization. In some embodiments, purely mechanical abrasion is achieved by using a belt grinding machine, a standard wafer backgrinder, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

The electrical system can be a stand-alone system that uses the semiconductor device to perform one or more electrical functions. Alternatively, the electrical system can be a subcomponent of a larger system. For example, the electrical system can be part of a cellular phone, personal digital assistant (PDA), digital video camera (DVC), or other electronic communication device. Alternatively, the electrical system can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction can be beneficial or essential for the products to be accepted by the market. The distance between semiconductor devices must be decreased to achieve higher density.

By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

FIGS. 2A-2D show a plurality of semiconductor die that have been formed according to front-end manufacturing methods and procedures as outlined above. More specifically, FIG. 2A shows a top or plan view of a semiconductor wafer, device wafer, or native wafer 110 with a base substrate material 112, such as, without limitation, silicon, germanium, gallium arsenide, indium phosphide, or silicon carbide, for structural support. A plurality of semiconductor die or components 114 is formed on wafer 110 separated by a non-active, inter-die wafer area or saw street 116 as described above. Saw streets 116 provide cutting areas to singulate semiconductor wafer 110 into individual semiconductor die 114.

Figure 2B:
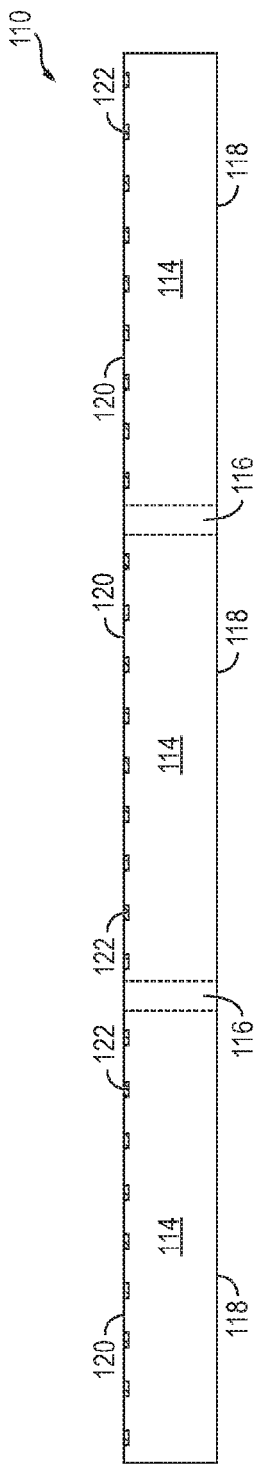

FIG. 2B shows a cross-sectional profile view of a portion of semiconductor wafer 110, perpendicular to the view shown in FIG. 2A. Each semiconductor die 114 has a backside or back surface 118 and an active surface 120 opposite the backside. The active surface 120 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 120 to implement analog circuits or digital circuits, such as DSP, ASIC, memory, or other signal processing circuit. The semiconductor die 114 may also contain IPDs such as inductors, capacitors, and resistors, for RF signal processing.

An electrically conductive layer or contact pad 122 is formed over active surface 120 using PVD, CVD, electrolytic plating, electroless plating process, or other suitable metal deposition process. Conductive layer 122 can be one or more layers of aluminum (Al), copper (Cu), tin (Sn), nickel (Ni), gold (Au), silver (Ag), or other suitable electrically conductive material. Conductive layer 122 operates as contact pads or bond pads electrically coupled or connected to the circuits on active surface 120. Conductive layer 122 can be formed as contact pads disposed side-by-side a first distance from the edge of semiconductor die 114, as shown in FIG. 2B. Alternatively, conductive layer 122 can be formed as contact pads that are offset in multiple rows such that a first row of contact pads is disposed a first distance from the edge of the die, and a second row of contact pads alternating with the first row is disposed a second distance from the edge of the die.

FIG. 2C shows an optional insulating or passivation layer 126 conformally applied over active surface 120 and over conductive layer 122. Insulating layer 126 can include one or more layers that are applied using PVD, CVD, screen printing, spin coating, spray coating, sintering, thermal oxidation, or other suitable process. Insulating layer 126 can contain, without limitation, one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), polymer, polyimide, benzocyclobutene (BCB), polybenzoxazoles (PBO), or other material having similar insulating and structural properties. Alternatively, semiconductor die 114 are packaged without the use of any PBO layers, and insulating layer 126 can be formed of a different material or omitted entirely. In another embodiment, insulating layer 126 includes a passivation layer formed over active surface 120 without being disposed over conductive layer 122. When insulating layer 126 is present and formed over conductive layer 122, openings are formed completely through insulating layer 126 to expose at least a portion of conductive layer 122 for subsequent mechanical and electrical interconnection. Alternatively, when insulating layer 126 is omitted, conductive layer 122 is exposed for subsequent electrical interconnection without the formation of openings.

FIG. 2C also shows electrical interconnect structures 128 can be formed as studs, columns, pillars, or posts that are disposed over, and coupled or connected to, conductive layer 122. Interconnect structures 128 can be formed directly on conductive layer 122 using patterning and metal deposition processes such as printing, PVD, CVD, sputtering, electrolytic plating, electroless plating, metal evaporation, metal sputtering, or other suitable metal deposition process. Interconnect structures 128 can be one or more layers of Al, Cu, Sn, Ni, Au, Ag, palladium (Pd), or other suitable electrically conductive material and can include one or more UBM layers. In an embodiment, a photoresist layer is deposited over semiconductor die 114 and conductive layer 122. A portion of photoresist layer is exposed and removed by an etching development process. Electrical interconnect structures 128 are formed as pillars or copper pillars in the removed portion of the photoresist and over conductive layer 122 using a selective plating process. The photoresist layer is removed leaving interconnect structures 128 that provide for subsequent mechanical and electrical interconnection and a standoff with respect to active surface 120 and insulating layer 126, if present. In some instances interconnect structures 128 include a height H1 in a range of 10-100 micrometers (μm), and can be solder free. In other instances interconnect structures 128 include a height in a range of 20-50 μm. In yet other instances interconnect structures 128 include a height of about 35 μm.

FIG. 2C further shows wafer 110 may undergo an optional grinding operation with grinder 130 to planarize back surface 118 and reduce a thickness of the wafer. A chemical etch can also be used to remove and planarize a portion of wafer 110.

FIG. 2D shows after the formation of interconnect structures 128 and the optional grinding of wafer 110, wafer 110 is singulated through saw streets 116 using a saw blade or laser cutting tool 132 into individual semiconductor die 114.

FIG. 3A shows a temporary carrier or substrate 136 containing temporary or sacrificial base material such as silicon, polymer, stainless steel, or other suitable low-cost, rigid material for structural support. An optional adhesive, interface layer, or double-sided tape 138 is formed over carrier 136 as a temporary adhesive bonding film or etch-stop layer. In an embodiment, such as shown in FIG. 3B, carrier 136 is a ring-shaped film frame comprising an open center portion that supports tape 138 at a periphery of the tape.

FIG. 3A further shows semiconductor die 114 from FIG. 2D mounted face up to carrier 136 and interface layer 138 with backside 118 oriented towards the substrate and active surface 120 oriented away from the carrier. Semiconductor die 114 can comprise a first semiconductor die 114a, that can be dedicated or directed to a particular purpose, such as logic or memory, and a second semiconductor die 114b that can be a dedicated or directed to a particular purpose different from the first semiconductor die 114a, such as memory or logic, respectively. Semiconductor die 114 can be placed over carrier 136 using a pick and place operation or other suitable operation. An adhesive 141 is optionally disposed between backside 118 of semiconductor die 114 and carrier 136. Adhesive 141 can be thermal epoxy, epoxy resin, B-stage epoxy film, ultraviolet (UV) B-stage film with optional acrylic polymer, or other suitable material. In an embodiment, adhesive 141 can be disposed over backside 118 before semiconductor die 114 are mounted over carrier 136. Alternatively, adhesive 141 can be disposed on carrier 136 before mounting the semiconductor die to the carrier. In other embodiments, adhesive 141 is omitted and the semiconductor die 114 are mounted directly to adhesive 138 without use of adhesive 141 so that the backside 118 directly contacts the interface layer 138. When the adhesive 141 is omitted, back surfaces 118 of the semiconductor die 144, including a first semiconductor die 114a and a second semiconductor die 114b can be depressed within the carrier tape 138 before encapsulating the first semiconductor die 114a and the second semiconductor die 114b.

Semiconductor die 114 are mounted to carrier 136 such that the semiconductor die are separated by a space or gap 140 when mounted over carrier 136 that provides an area for a subsequently formed a fine-pitch build-up interconnect structure, and can additionally include space for passive components disposed within the gap 140. A size of the gap 140 includes sufficient area for optionally mounting semiconductor devices or components within the subsequently formed embedded die panel or molded core unit.

FIG. 3C shows an encapsulant 142 is deposited using a paste printing, compression molding, transfer molding, liquid encapsulant molding, lamination, vacuum lamination, spin coating, or other suitable applicator. Specifically, FIG. 3C shows a mold 144 with a plurality of sidewalls 146 brought together with top portion or plate 145, carrier 136, and interface layer 138 to enclose semiconductor die 114 within the mold 144 for subsequent encapsulation. Mold 144 can also include a bottom portion on which carrier 136 is placed and to which sidewalls 146 can be in contact. In an embodiment, carrier 136 and adhesive 138 serve as the bottom mold portion for the subsequent encapsulation process. Alternatively, semiconductor die 114, carrier 136, and interface layer 138 may be disposed within a mold including multiple portions, such as top and bottom portions. Mold 144 is brought together by moving mold 144 around semiconductor die 114, or alternatively, by moving the semiconductor die into the mold.

FIG. 3C further shows mold 144 encloses semiconductor die 114 within a cavity or open space 150. Cavity 150 extends between mold 144 to semiconductor die 114 and interface layer 138. A volume of encapsulant 142 is disposed over semiconductor die 114 and carrier 136. Inlet 148 can be an exhaust port with optional vacuum assist 154 for providing a vacuum in cavity 150; however, inlet 148 does not provide an escape path for encapsulant 142. Encapsulant or molding compound 142 can be a polymer composite material, such as epoxy resin with filler, epoxy acrylate with filler, or polymer with proper filler. The volume of encapsulant 142 is measured according to the space requirements of cavity 150 less the area occupied by semiconductor die 114 and any additional semiconductor devices that might be present. Encapsulant 142 is disposed over semiconductor die 114 and between sidewalls 146. Top portion 145 of mold 144 can move along sidewalls 146 toward encapsulant 142 and semiconductor die 114 until the top portion contacts the encapsulant to evenly disperse and uniformly distribute encapsulant 142 within cavity 150 around semiconductor die 114. A viscosity and elevated temperature of encapsulant 142 can be selected for uniform coverage, for example, a lower viscosity and elevated temperature can increase the flow of the encapsulant for molding, paste printing, and spin coating. The temperature of encapsulant 142 can also be controlled within cavity 150 to promote curing of the encapsulant. Semiconductor die 114 are embedded together in encapsulant 142, which is non-conductive and environmentally protects the semiconductor die 114 from external elements and contaminants, to form panel, plastic panel, embedded die panel, reconstituted panel, reconstituted wafer, molded panel, or molded wafer 158. As such, the embedded die panel 158 can be formed by encapsulating at least four sides surfaces 124 and the active surface 120 of the first semiconductor die 114a, the second semiconductor die 114b, and the side surfaces 127 of the conductive interconnects 128 with encapsulant 142 in a single step, in a same process, or at a same time.

Figure 3E:
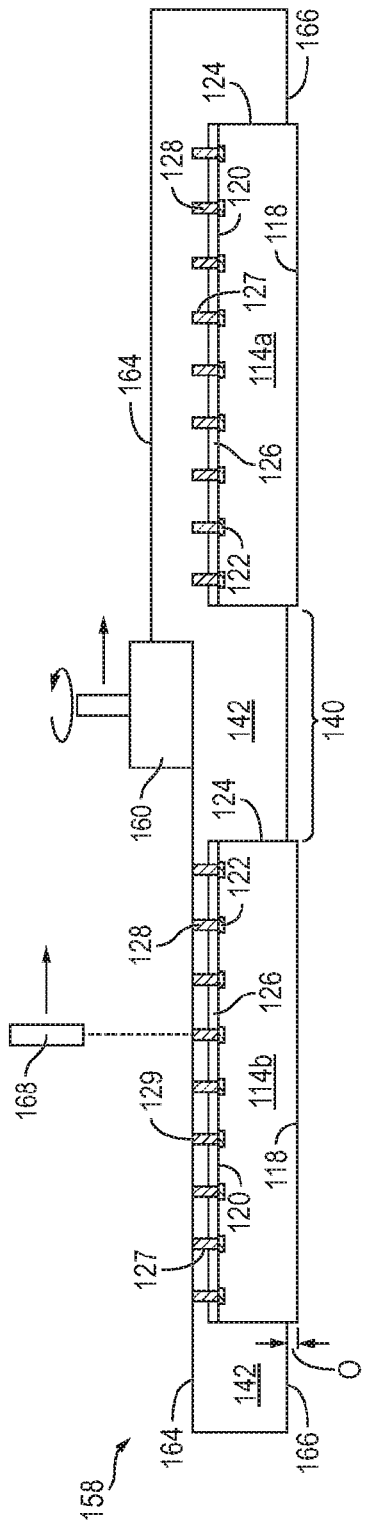

FIG. 3D shows an encapsulation process similar to the process described in relation to FIG. 3C. FIG. 3D differs from FIG. 3C by the orientation of semiconductor die 114 relative to carrier 136 and adhesive 138. Instead of mounting semiconductor die 114 face up with active surface 120 oriented away from carrier 136 as shown in FIG. 3C, FIG. 3D shows an embodiment in which semiconductor die 114 are mounted face down with active surface 120 oriented toward carrier 136. Accordingly, adhesive 141 can be omitted from over back surface 118 of semiconductor die 114. Furthermore, while the processing shown subsequently in FIGS. 3E-3K is shown with respect to the packaging of semiconductor die 114 illustrated in FIG. 3C, the subsequent processing is likewise applicable to the packaging illustrate in FIG. 3D.

In FIG. 3E, semiconductor die 114 are removed from mold 144 as part of the panel 158, and the molded wafer 158 can optionally undergo a curing process to cure encapsulant 142. Carrier 136 and adhesive 138 can be removed immediately or soon after removal from the mold 144 and before subsequent processing. Alternatively, the carrier 136, the interface layer 138, or both, can be removed after subsequent processing, such as after the formation of build-up interconnects structure 170. In any event, the carrier 136 and the interface layer 138 can be removed by chemical etching, mechanical peeling, CMP, mechanical grinding, thermal bake, UV light, laser scanning, or wet stripping to expose encapsulant 142.

A front surface or first surface 164 of encapsulant 142 can be substantially coplanar with ends 129 of conductive interconnects 128, as discussed in greater detail below. A back surface or second surface 166 of encapsulant 142, opposite the first surface 164, can be substantially coplanar with adhesive 141 or back surface 118 of the semiconductor die 114. Alternatively, the back surface 166 of the encapsulant 142 can be substantially non-coplanar or offset, with a distance or offset O, with respect to the backsides 118 of the semiconductor die 114, because of the semiconductor die 114 being depressed or recessed within the adhesive 138. The offset O can be a distance greater than 10 µm, and can also be in a range of 10-20 µm. Both the encapsulant 142 and the backsides 118 of the semiconductor die 114 can be exposed by the removal of the carrier 136 and interface layer 138. The embedded die panel 158 can includes a footprint or form factor of any shape and size that allows for, and facilitates, the subsequent processing required to form the FMFOMs, as described in greater detail below. In an embodiment, panel 158 includes a form factor similar to the form factor of a 300 millimeter (mm) semiconductor wafer and includes a circular footprint having a diameter of 300 mm. However, other diameters, including 200 mm, 400 mm, and any other suitable size diameter can also be used. The form factor or footprint of the panel 158 can also be square, rectangular, or of any other suitable shape.

FIG. 3E also shows panel 158 undergoes an optional grinding operation with grinder 160 to planarize the surface and reduce a thickness of the panel 158. A chemical etch can also be used to remove and planarize a portion of encapsulant 142 in panel 158. Thus, a surface or end 129 of interconnect structures 128 is exposed with respect to encapsulant 142, opposite attachment of the interconnects structures 128 being attached to contact pads 122, to provide for electrical connection between semiconductor die 114 and a subsequently formed fine-pitch build-up interconnect structure. The sides or sidewalls of the conductive interconnects 128 can extend between the contact pads 122 and the ends 129 along the height H1 of the conductive interconnects 128, the sides 127 being covered or in contact with the encapsulant.

With exposure of the ends 129 of interconnects 128 from the encapsulant 142, the panel 159 can be scanned, imaged, or otherwise measured with a scanner or imager 168 to determine the position, orientation, or both, of each semiconductor die 114 and conductive interconnects 128, as set forth in U.S. patent application Ser. Nos. 14/930,514 and 15/219,025, the entirety of the disclosure of which are hereby incorporated by reference.

Figure 3F:
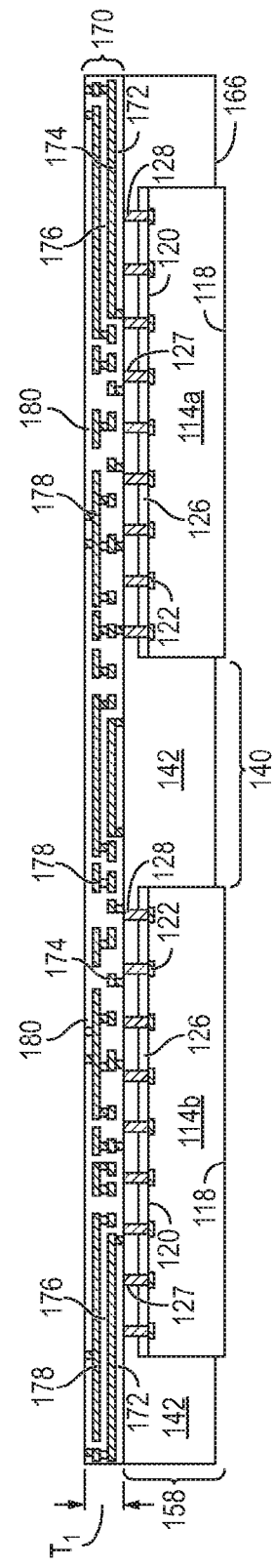

FIG. 3F shows forming a build-up interconnect structure, fine-pitch build-up interconnect structure, or high density multi-layer RDL routing pattern 170 over the molded panel 158 to electrically connect, and provide routing between, semiconductor die 114, such as 114a and 114b, through conductive interconnects 128. Interconnecting the conductive interconnects 128 of the first semiconductor die 114a and the second semiconductor die 114b can be done without a silicon interposer by forming the fine-pitch build-up interconnect structure 170 over the embedded die panel 158 to form at least one core unit, or molded core unit 200. The fine-pitch build-up interconnect structure 170 can be formed to directly contact the conductive interconnects 129, such as ends 129 of the conductive interconnects 128. As used herein the spacing or density of the fine-pitch build-up interconnect structure 170 can comprise line and space width, or pitch, of less 5 µm, less than 3 µm, and also less than 1 µm.

While FIG. 3F shows the build-up interconnect structure 170 is shown comprising three conductive layers and three insulating layer, a person of ordinary skill in the art will appreciate that fewer layers or more layers can be used depending on the configuration and design of the FMFOM. The build-up interconnect structure 170 can optionally comprise a first insulating or passivation layer 172 formed or disposed over the reconstituted panel 158. The first insulating layer 172 can comprise one or more layers of $SiO_2$, $Si_3N_4$, SiON, $Ta_2O_5$, $Al_2O_3$, or other material having similar insulating and structural properties. The insulating layer 172 can be formed using PVD, CVD, printing, spin coating, spray coating, sintering or thermal oxidation. Openings or first level conductive vias can be formed through the insulating layer 172 over the conductive interconnects 128 to facilitate connection with the semiconductor die 114.

A first conductive layer 174 can be formed over the reconstituted panel 158 and over the first insulating layer 172 as a first RDL layer to extend through the openings in the first insulating layer 172, to electrically connect with the first level conductive vias, and to electrically connect with the conductive interconnects 128. Conductive layer 174 can be one or more layers of Al, Cu, Sn, Ni, Au, Ag, or other suitable electrically conductive material formed using a patterning and metal deposition process such as sputtering, electrolytic plating, and electroless plating, or other suitable process.

A second insulating or passivation layer 176, which can be similar or identical to the first insulating layer 172, can be disposed or formed over the reconstituted panel 158, the first conductive layer 174, and the first insulating layer 172. An opening or second level conductive via can be formed through the second insulating layer 176 to connect with the first conductive layer 174.

A second conductive layer 178, which can be similar or identical to the first conductive layer 174, can be formed as a second RDL layer over reconstituted panel 158, over the first insulating layer 172, over the first conductive layer 174, over the second level conductive via, or within an opening of the second insulating layer 172, to electrically connect with the first conductive layer 174, the first level and second level conductive vias, and the semiconductor die 114.

A third insulating or passivation layer 180, which can be similar or identical to the first insulating layer 172, can be disposed or formed over the second conductive layer 178 and the second insulating layer 176. An opening or a third level conductive via can also be formed in or through the third insulating layer 180 to connect with the second conductive layer 178.

A third conductive layer or UBM 182 can be formed over the third insulating layer 180 and the third level conductive via to electrically connect with the other conductive layers and conductive vias within the build-up interconnects structure 170, as well as electrically connect to the semiconductor die 114, the conductive interconnects 128, and the conductive interconnects 52. UBMs 182, like all of the layers, plating layers, or conductive layers formed by a plating process as presented herein, can be a multiple metal stack comprising one or more of an adhesion layer, barrier layer, seed layer, or wetting layer. The adhesion layer can comprise titanium (Ti), or titanium nitride (TiN), titanium tungsten (TiW), Al, or chromium (Cr). The barrier layer can be formed over the adhesion layer and can be made of Ni, NiV, platinum (Pt), palladium (Pd), TiW, or chromium copper (CrCu). In some instances the barrier layer can be a sputtered layer of TiW or Ti and can serve as both the adhesion layer and the barrier layer. In either event, the barrier layer can inhibit unwanted diffusion of material, like Cu. The seed layer can be Cu, Ni, NiV, Au, Al, or other suitable material. For example, the seed layer can be a sputtered layer of Cu comprising a thickness of about 2000 angstroms (e.g., 2000 plus or minus 0-600 angstroms).

As shown in FIG. 3G, the seed layer can be formed over the barrier layer and can act as an intermediate conductive layer below subsequently formed interconnect structures, posts, pillars, or columns 184 and bumps or balls 186. In some instances, bumps 186 can be formed without the interconnect structures 184, and the wetting layer can comprise a layer of Cu with a thickness in a range of about 5-11 µm or 7-9 µm. Bumps 186, such as when formed of SnAg solder, can consume some of the Cu UBM 182 during reflow and forms an intermetallic compound at the interface between the solder bump 184 and the Cu of the wetting layer. However, the Cu of the wetting layer can be made made thick enough to prevent full consumption of the Cu pad by the solder during high temperature aging. In some instances, the UBMs 182 can comprise Ni, Pd and Au. UBMs 182 can provide a low resistive interconnect to build-up interconnect structure 170 as well as a barrier to solder diffusion and seed layer for solder wettability.

Figure 3I:
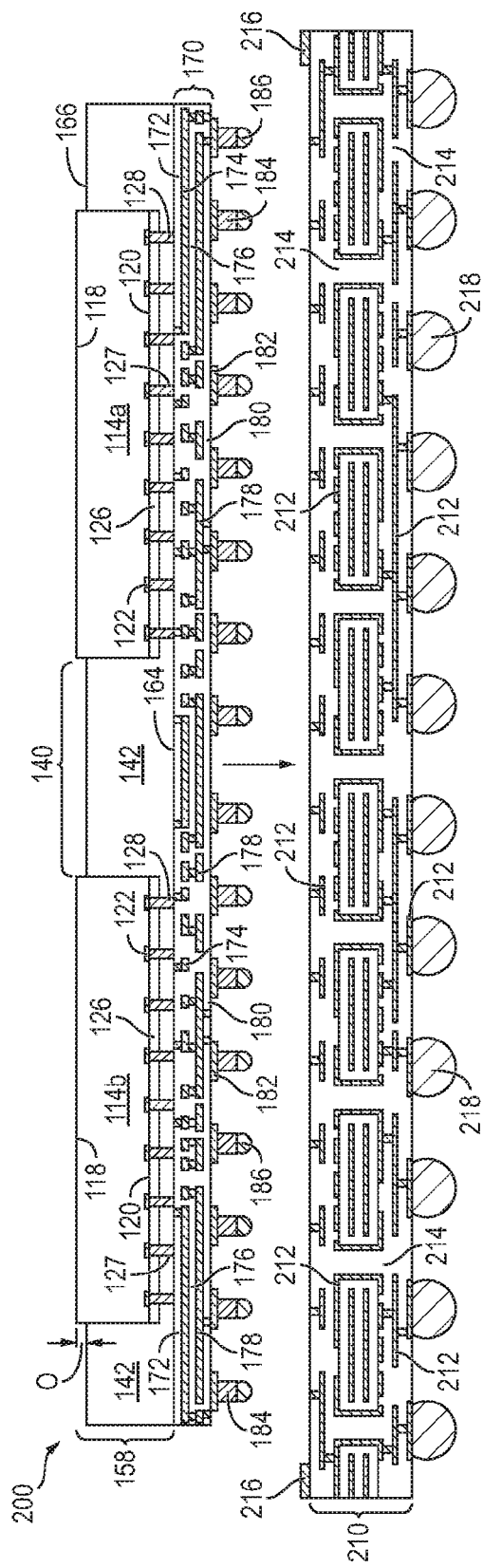

After the formation of conductive interconnects 184 and bumps 186, the electrical connectivity of the at least one molded core unit 200 can be tested before mounting the at least one molded core unit 200 to the multi-layer substrate, organic substrate, organic multi-layer substrate, or high density build-up (HDBU) substrate 210 shown in FIG. 3I.

The completed fine-pitch interconnect structure 170 can comprise overall thickness $T_1$ in a range of 5 µm-12 µm, 12 µm-25 µm, or 25 µm-70 µm. The planarity of the fine-pitch interconnect structure 170 can be less than or equal to 10 µm, which can be equal to a planarity of the panel 158.

FIG. 3G also shows that after the formation of the fine-pitch interconnect structures 170 and interconnect structures 184 and bumps 186, panel 158 can be singulated through saw streets 202 using a saw blade or laser cutting tool 190 to form one or more, or plurality, of molded core units 200. The molded core units 200 can comprise a thickness or height T2 in a range of 0.15-1.1 millimeters (mm), with the maximum thickness of about 1.1 mm and a minimum thickness of about 0.15 mm, wherein about can equal a percent difference less than or equal to 20%, 10%, or 5%.

FIG. 3H shows a plan view of the panel 158 comprising a plurality of the core units 200 before singulating the core units 200 from the panel 158, as shown in in the profile sectional view of FIG. 3G.

FIG. 3I shows a cross-sectional view similar to the view of FIG. 3G, in which the core unit 200 is being mounted to the multi-layer substrate 210. The multi-layer substrate 210 can comprise a number of conductive layers 212 and insulating layers 214 for the routing of electrical signal together with the molded core unit 200, and according the configuration and design of the FMFOM 230. The conductive layer 212 can comprise one or more layers of Al, Cu, Sn, Ni, Au, Ag, or other similar material. The insulating layers 214 can comprise one or more layers of one or more layers of $SiO_2$, $Si_3N_4$, SiON, $Ta_2O_5$, $Al_2O_3$, silicon, germanium, gallium arsenide, indium phosphide, silicon carbide, polymer, beryllium oxide, or other suitable rigid material for structural support. Alternatively, insulating layers 214 can be one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabricsor other material having similar insulating and structural properties. The multi-layer substrate 210 can also comprise one or more shielding pads 216 that can be formed at a top or first surface of the multi-layer substrate 210 and can be formed of one or more layers of conductive material, including Al, Cu, Sn, Ni, Au, Ag, or other similar material. The pads 216 can provide a location, mounting site, or attachment point for an electro magnetic interference (EMI) shield 226, as shown in FIG. 3K.

The multi-layer substrate 210 can also comprise a plurality of bumps or balls 218 formed over, or attached to the substrate 210 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be bonded to the multi-layer substrate 210, including a portion of the conductive layer 212, using a suitable attachment or bonding process. In an embodiment, the bump material can be reflowed by heating the material above its melting point to form spherical balls or bumps 218. In some applications, bumps 218 are reflowed a second time to improve electrical contact to the multi-layer substrate 210. In an embodiment, the bumps 218 are formed over a UBM having a wetting layer, barrier layer, and adhesive layer. The bumps 218 can also be compression bonded to the multi-layer substrate 210. Bumps 218 represent a type of interconnect structure that can be formed over the multi-layer substrate 210. The interconnect structure can also use bond wires, conductive paste, stud bump, micro bump, or other electrical interconnect.

FIG. 3I also shows the core unit 200 can have the temporary carrier 136 removed after the formation of the interconnect structure 170, the interconnect structures 184, and the bumps 186, such as just before mounting the core unit 200 to the multi-layer substrate 210. In other instances, the temporary carrier 136 can be removed after the formation of the panel 158 and before the formation of the interconnect structure 170. With the temporary carrier 136 removed, and the core unit 200 tested to ensure proper operation and freedom of defects, the core unit 200 can be mounted to the multi-layer substrate 210. In any event, before mounting the at least one molded core unit 200 to the multi-layer substrate 210, the electrical connectivity of the at least one molded core unit 200 can be tested to ensure proper operation and to detect defects. When defects are detected, the faulty molded core unit 200 can be discarded or repurposed rather than being mounted to the multi-layer substrate 210, thereby avoiding the incurring of additional time and expense in the production of a faulty package or component. In some instances, the plurality of molded core units 200 will be tested before singulation by saw 190 to allow for concurrent or simultaneous testing of the plurality of the molded core units 200, such as at the level of the panel 158.

In the past, when silicon interposers were used, such as with semiconductor package with Si interposer 40, such testing was unavailable for the package 40 because the Si interposer 20 would be likely to be damaged during testing. As such, conventional semiconductor packages with Si interposers 40 were not tested until the package was completed and mounted to the BGA substrate 30 with the bumps 26.

After testing, the interconnect structures 184 and bumps 186 can be used in flip-chip mounting the core unit 200 to the multi-layer substrate 210, the interface between multi-layer 210 and the interconnect structures 184 and bumps 186 having a bump coplanarity of less than or equal to 15 μm. The coefficient of thermal expansion (CTE) of the core unit 200 can be within 40% of the CTE of the multi-layer substrate 210. Stated another way, a percent difference in the CTE of the core unit 200 and the multi-layer substrate 210 can be less than or equal to 40 percent.

Figure 3J:
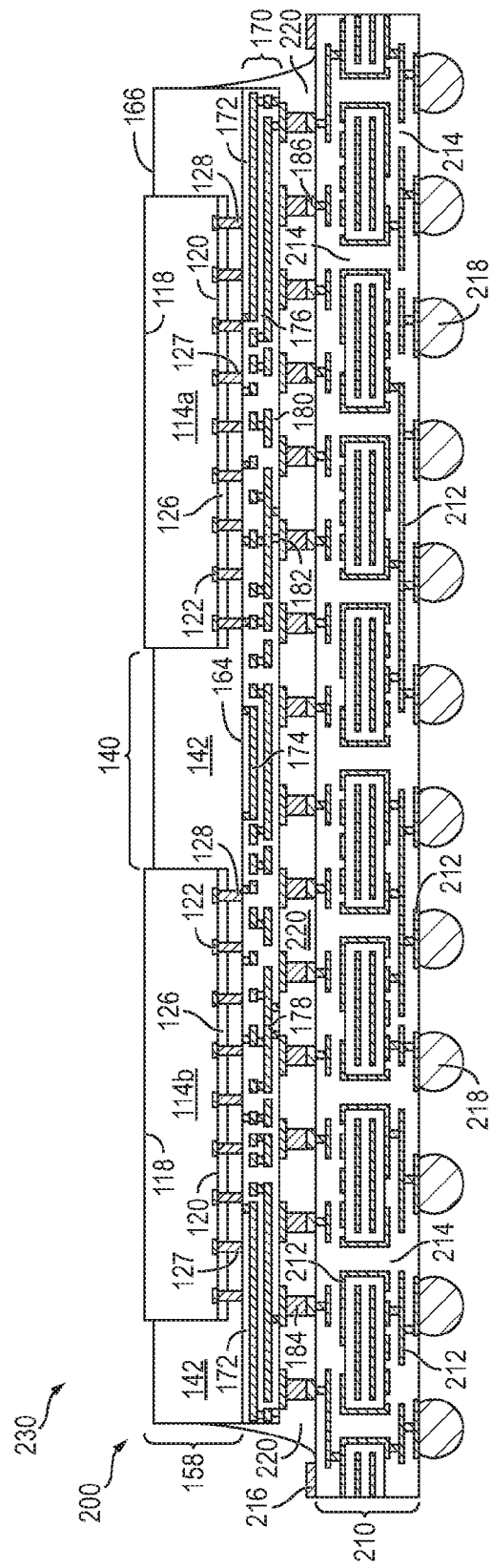
Figure 3K:
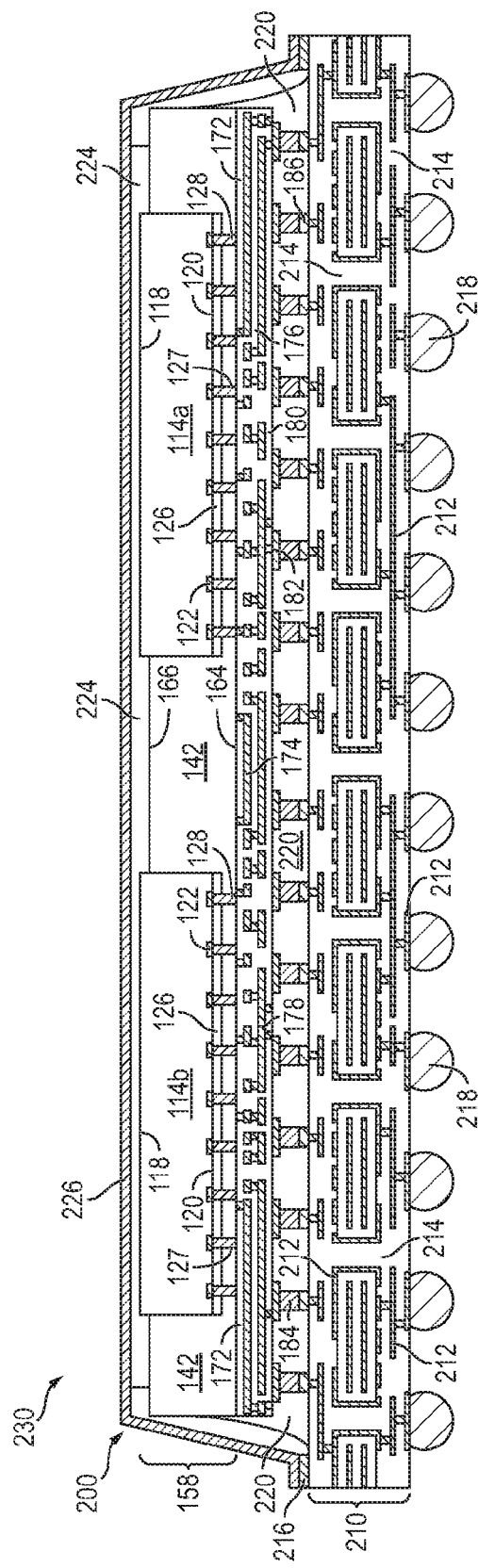

FIG. 3J shows an optional underfill material or molded underfill (MUF) 220 can be deposited under the core unit 200, over the multi-layer substrate 210, or both. The underfill material 220 can include epoxy, epoxy-resin adhesive material, polymeric materials, films, or other non-conductive materials. Underfill 220 can be non-conductive and environmentally protects the interface or electrical interconnection between the core unit 200 and the multi-layer 210, such as the interconnects tructures 184 and bumps 186 from external elements and contaminants, as well as provide structural support. In some instances the underfill 220 can be pumped from a reservoir to a dispensing needle so that the underfill 220 is injected under pressure from the dispensing needle between the core unit 200 and the multi-layer 210. The underfill 220 need not be disposed between the semiconductor die 114 and a TSV substrate or Si interposer like Si interposer 20, because of the configuration and design of the core unit 200 and the omission of a Si interposer like Si interposer 20. In some instances a vacuum assist can draw the MUF 220 to aid with uniform distribution. The underfill 220 can be polymer composite material, such as epoxy resin with filler, epoxy acrylate with filler, or polymer with proper filler.

FIG. 3K shows providing or disposing a thermal interface material (TIM) 224 over the core unit 200, including over the offset back surfaces 118 of the first semiconductor die 114a and the second semiconductor die 114b, and coupling an electromagnetic interference (EMI) shield or heat sink 226 to the molded core unit 200 with the TIM 224 disposed between the heat sink 226 and the molded core unit 200. TIM 224 can comprise thermal epoxy, thermal epoxy resin, thermal conductive paste, aluminum oxide, zinc oxide, boron nitride, pulverized silver, thermal grease or other suitable material. The EMI shield 226 can be formed of Al, ferrite or carbonyl iron, stainless steel, nickel silver, low-carbon steel, silicon-iron steel, foil, conductive resin, and other metals and composites capable of blocking or absorbing electromagnetic interference (EMI), radio frequency interference (RFI), harmonic distortion, and other interdevice interference. Shield 226 can also be a non-metal material such as carbon-black or aluminum flake to reduce the effects of EMI and RFI. By coupling the EMI shield 226 to the molded core unit 200 with the TIM 224 disposed between the EMI shield 226 and the molded core unit 200, electromagnetic interference can be reduced, and thermal performance of the FMFOM 230 can be improved. To facilitate performance, the shield 226 can be electrically connected through shielding pad 216 to an external low-impedance ground point.

Figure 4:
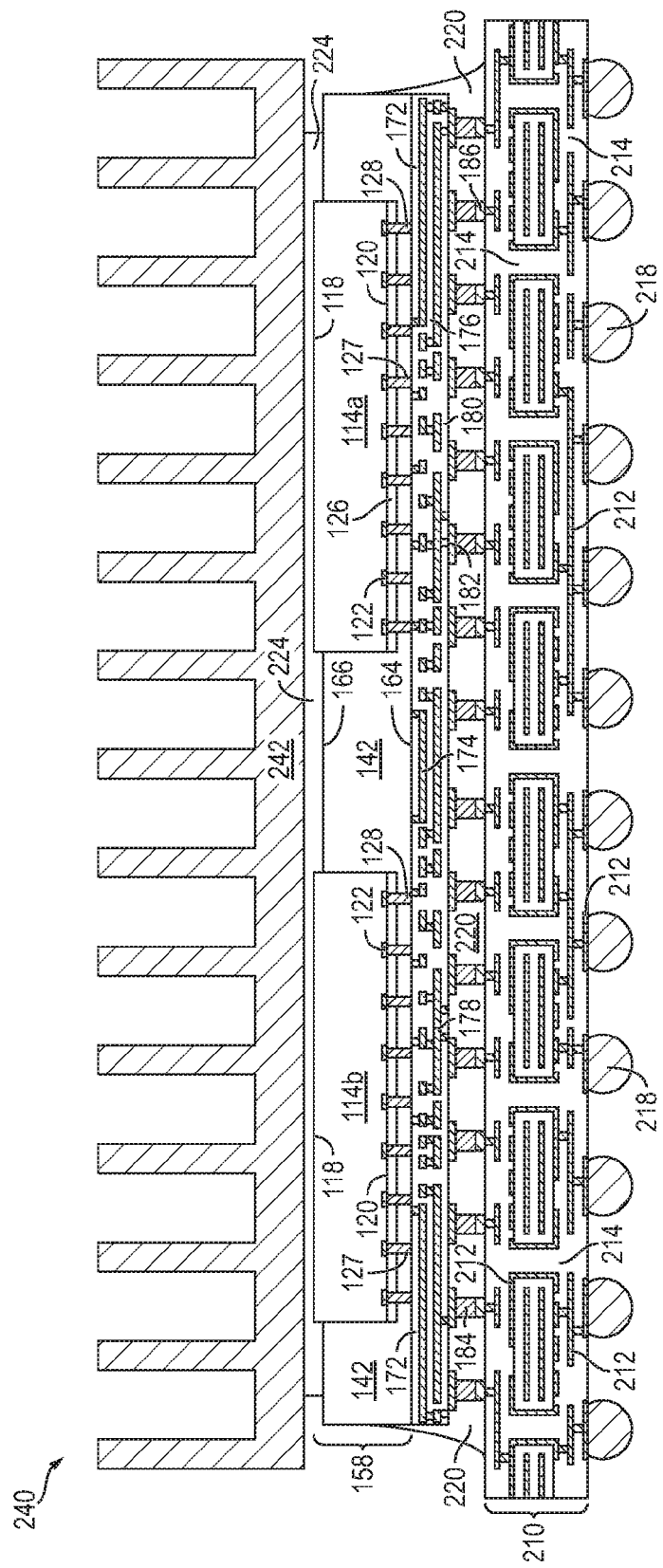
FIG. 4 illustrates an aspect of a thermally enhanced FMOM.

FIG. 4 shows a FMFOM 240 similar to the FMFOM 230 shown in FIG. 3K. FMFOM 240 differs from FMFOM 230 by including a heat sink or heat spreader 242 instead of the EMI shield 226. The heat sink 242, like the EMI shield 226, is coupled to the molded core unit 200 with the TIM 224 disposed between the heat sink 242 and the molded core unit 200. The heat sink 242 can be Cu, Al, or other material with high thermal conductivity. By coupling the heat sink 242 to the molded core unit 200 with the TIM 224 disposed between the heat sink 242 and the molded core unit 200, thermal performance of the FMFOM 240 can be improved. Thermal performance can be improved by forming a thermally conductive path that aids with distribution and dissipation of heat generated by semiconductor die 114.

FMFOM 240 can be shipped with back surfaces 118 of semiconductor die 114 exposed for direct attachment of an external heat sink, such as heat sink 242, after shipping. Passive components can be integrated on or within the multi-layer substrate 210, as well as within the molded core unit 200. The photopolymers typically used for wafer level redistribution processes (e.g. PBO or PI) within the fine-pitch build-up interconnect structure 170 can be replaced with inorganic dielectrics for enhanced mechanical reliability, routing density and thermal stability. The semiconductor die 114 can be mounted to a heat spreader or heat sink, such as heat sink 242, with a die attach material before being attached to, or being placed on, the temporary carrier 136. The FMFOM 240 can also be mounted directly to a system motherboard using flip-chip, LGA, or BGA interconnects for bumps 218.

As illustrated with FMFOMs 230 and 240, the FMFOMs can be formed without a Si interposer, such as Si interposer 20, while still providing for high density multi-chip routing, similar to the very high wiring density between devices achieved with Si interposers, through the fine-pitch build-up interconnect structure 170. The FMFOMs 230, 240 can comprise multi-layer fine pitch routing (e.g. routing comprising a 2 µm line and space) with fine pitch (40 µm), as well as solderless Cu stud interconnects 128 for high density die-to-die routing. The FMFOMs 230, 240 can comprise large area Cu studs 128 that can be formed on semiconductor chips 114 and on commonly connected die bond pads 122 for improved thermal and power distribution. Unit specific patterning (such as Adaptive Patterning™) can ensure high interconnect yield between semiconductor die 114 within the molded interposer 170 for FMFOMs 230, 240. The FMFOMs 230, 240 can comprise Cu pillars, Pb free solder bumps for flip-chip interconnect to the multi-layer substrate 210, or both. The FMFOMs 230, 240 can comprise exposed backsides 118 of semiconductor die 114 with offset O that slightly protrude above the back surface 166 of the mold compound 142 for superior TIM 224 bond line thickness control. Advantageously, and unlike conventional semiconductor package with Si interposers 40, the core units 200 of the FMFOMs 230, 240 can be fully testable prior to assembly to the high density multi-layer substrate 210.

The FMFOMs 230, 240 facilitate integration of different tupes of chips or semiconductor die, including different types or numbers of nodes without use of the Si interposer 20, due to the unit specific patterning of the build-up interconnect structure 170, which allows for multiple different structures on top, including different chip types (memory, logic, analog), and chips developed on different process nodes (e.g., 130 nm, 90 nm, or 20 nm) within a single core unit 200. The high density routing of build-up interconnect structure 170 enables a high speed interface between different memory and logic semiconductor die 114. A large semiconductor die 114 can also be partitioned into smaller semicondcutor die with minimal performance loss to save cost on the wafer fabrication through higher die yields. The core unit 200 can integrate other active and passive devices into the core unit 200, allowing for a more simplified PCB design. Because traditional logic chips comprise a significant amount of a reusable intellectual property (IP), separate semiconductor die 114 within the core unit 200 can allow for a split or division between proven semiconductor chip IP and semiconductor chips with new IP that include added functionality that can be connected side by side within the core unit 200. A chip design utilizing the FMFOM 230, 240 designs can also save significant design and manufacturing costs taken up by building input/output (I/O) buffers and on-chip memory.

A number of advantages exist with respect to FMFOM 230, 240 over conventional semiconductor packages with Si interposers 40. First, conventionally the Si interposer 20 requires very fine pitch solder interconnects 12 between the chips 10 and the interposer 20, the assembly yield loss associated with the fine pitch flip-chip 10 for the SI interposer 20 can be a concern, and the reliability of very small solder joints with microbumps 12 can also be a concern. However, with the FMFOMs 230, 240, very fine pitch solder joints can be eliminated and be replaced by high density RDL routing lines within the fine-pitch build-up interconnect structure 170, such as conductive layer 174 directly connecting, or being in contact with, the conductive interconnects 128, which can be formed as Cu stud bumps on the semiconductor die 114 without the use of solder, microbumps, or both.

Second, the costs for manufacturing Si interposers 20 can typically be very high because the typical process must be performed in an advanced wafer fabrication plant (advanced wafer fab). TSVs 22 must typically be formed within the interposer 20, flip-chip bumps 26 must be formed on the bottom of the interposer 20, and the TSV process requires a very thin Si wafer 20, typically about 100 µm in thickness, which can result in warpage and handling concerns in manufacturing. With FMFOMs 230, 240, the TSV process can be completely eliminated by using the fine-pitch build-up interconnect structure 170 on the panel 158, and the solder bumps that would normally be formed on the bottom of the Si interposer 20 are not formed, there being instead interconnect structures 184, bumps186, or both, formed directly over the final routing layer, such as conductive layer178 formed on the panel 158, which can substantially reduce cost and difficulty of processing. Relatedly, in forming the FMFOMs 230, 240 the flip-chip assembly step for semiconductor die 10 and microbumps 12 used in packages 40 is not performed, and by comparison is eliminated, thereby further simplifying the package assembly process of FMFOMs 230, 240 when compared to packages 40.

Third, the process of attaching the semiconductor die 10 to the thin Si interposer 20, and further attaching the Si interposer 20 to the BGA substrate 30 with a conventional Si interposer package 40 can be difficult due to warpage of the Si interposer. On the other hand, with the FMFOMs 230, 240, the high density, multi-layer RDL routing patterns 174, 178, within the fine-pitch build-up interconnect structure 170 can be applied to the semiconductor die 114 within the molded panel 158, which is a more stable structure than the Si interposer 20 and is less susceptible to warpage.

Fourth, the FMFOMs 230, 240 provide an additional advantage in that semiconductor packages 40 comprising a conventional Si interposers 20 are generally difficult to test for proper function after the semiconductor die 10 are attached to the Si interposer 20 and before the Si interposer 20 is assembled to the expensive substrate 30 because the Si interposer 20 is very thin and difficult to handle. To the contrary, the FMFOMs 230, 240 comprise semiconductor die 114 embedded within the plastic pane1158 that are conducive to testing after the high density RDL routing 170 and flip-chip bumps 184, 186 have been applied and before assembly of the core units 200 to the multi-layer substrate 210. Testing of the core units 200 without the difficulty presented by the thin Si interposer 20 provides an advantage of reducing assembly yield loss.

Fifth, in the semiconductor package with Si interposer 40, reliability of the flip-chip interconnect with microbumps 12 is challenging because the CTE of the Si interposer 20 is much lower that the CTE of the substrate 30, which results in high stress and strain in temperature cycling that leads to increased package failure. On the other hand FMFOM 230, 240 includes mold compound or encapsulant 142 as part of panel 158 that has a higher CTE than the Si interposer 20, resulting in a reduced CTE mismatch with the multi-layer substrate 210.

A number of advantages exist with respect to FMFOM 230, 240 over conventional embedded wafer level ball grid array (eWLB) packages. EWLB packages involve placing a semiconductor die face-down on tape, molding or encapsulating over the back surface of the semiconductor die units to form a panel or molded panel, and then removing the tape and forming an interconnect structure over, and in direct contact with, the active surface of the semiconductor die to make electrical connection to the active surface of the semiconductor die.

First, eWLB structures typically comprise the semiconductor die being slightly compressed into the tape resulting in a non-uniform surface at the interface between the die and the fan-out encapsulation that can cause a topography that requires a lithography process with larger depth of field than on a planar of uniform surface. The resulting depth of field can limit the RDL feature size that can be applied to the panel. On the other hand, in the FMFOM process, the semiconductor die 114 can be attached face-up onto the carrier tape 138, the back of semiconductor die 114 being advantageously compressed into the tape 138 without causing the offset at the active surface as described above for eWLB structures. Additionally, the active side of the plastic panel 158 comprising encapsulated semiconductor die 114 can be planarized after molding or encapsulating the semiconductor die 114, which eliminates the problem of offset and depth of field so that it is possible to achieve very fine line and space RDL features using photolithography, unlike the unlike face down eWLB approach. As used herein, very fine line and spaces can include <5 µm line and space or <2 µm line and space using more advanced lithography tools) and will potentially enable use of thin inorganic dielectric layers between RDL traces for the FMFOMs 230, 240 that are not possible with eWLB packages.

Second, the uneven topography at an active surface of a typically prepared eWLB molded semiconductor die, described above, additionally provides an uneven surface for flip-chip bumps that can result in non-uniformity of the height of the flip-chip bumps. This can further result in yield loss due to open solder joints during flip-chip assembly to the substrate 30. The planar surface of semiconductor die in the plastic panel of the FMFOM 230, 240 can enable use of flip-chip interconnects to attach the molded core unit 200 to the multi-layer substrate 210, wherein flip-chip bumps formed on the active side can have bump coplanarity of less than or equal to 15 µm, producing high yielding assembly.

Third, in the die face-down configuration of forming eWLB packages, the entire back of the semiconductor die must be encapsulated. The semiconductor die in the eWLB module can later be exposed by grinding away the mold compound, but this approach often results in the mold compound and the back of the semiconductor die being coplanar. Coplanar mold compound and semiconductor die backs makes it difficult to attach a heat sink to the backs of the semiconductor die with a compressible TIM while precisely controlling TIM thickness over the back surfaces of the semiconductor die. However, the above issue is ameliorated with the FMFOM design and the offset O between the back surface 118 of semiconductor die 114 and the back surface 166 of the encapsulant 142.

Fourth, a problem with the TIM interacting with back surfaces of semiconductor die in the eWLB module can be overcome by the FMFOM process and design. For FMFOM 230, 240, after molding panel 158 and releasing the carrier 136, the back surfaces 118 of the semiconductor die 114 are already exposed in order to provide for mounting the heat sink 226, 242 to the backsides 118 of the semiconductor die 114. Additionally, with the FMFOMs 230, 240 the backsides 118 of the semiconductor die 114 are compressed into the temporary tape 138 so that the back surface 118 of the semiconductor die 114 are raised above the back surface of the mold compound 166 with an offset O greater than or equal to 10 µm, or greater than or equal to 40 µm. The offset O between the back surface 118 of the semiconductor die 114 and the corresponding back surface 118 of the encapsulant 142 of the plastic panel 158 can allow the compressible TIM 224 to form a thinner layer between the semiconductor die 114 and the heat sink 226, 242 compared to the thickness of TIM 224 between the back surface 166 of the encapsulant 142 and the heat sink 226, 242.

Fifth, the FMFOMs 230, 240 includes the encapsulant 142 applied over the active surface 120 and the sides 124 of the semiconductor die 114, which can include a CTE that is higher than a CTE of the corresponding structures in the eWLB modules. Thus. the higher CTE in the FMFOMs 230, 240 will reduce warpage and will result in less stress and strain on the interconnects 184, 186 between molded core unit 200 and the multi-layer substrate 210 than on the bumps 26 between Si interposer 20 and substrate 30 in conventional modules with Si interposers 40.

Sixth, a further advantage of the FMFOMs 230, 240 can include tailoring a size and density of conductive interconnects 128 and 184 as studs to reduce a size and produce a lower thermal resistance between the semiconductor die 114 and the conductive interconnects 128 and 184, which can be achieved in some particular instances by creating larger area conductive interconnects 128 and 184 commonly connected to power and ground nets.

Figure 5:
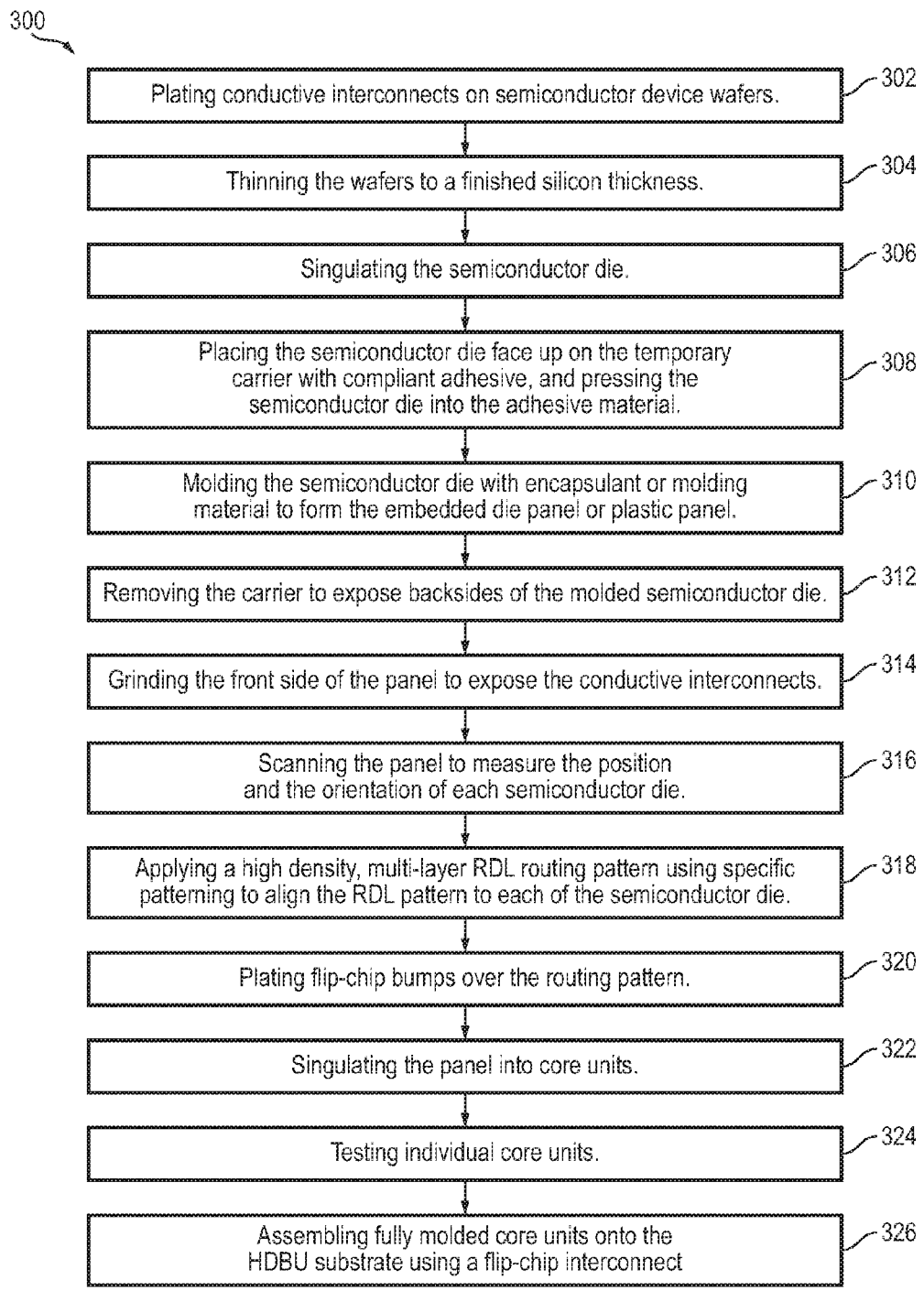
FIG. 5 illustrates a flow chart of elements included in forming a FMOM.

FIG. 5 shows a flow chart 300 illustrating a non limiting-example of a method of forming a thermally enhanced FMFOM 230, as illustrated and described in FIGS. 1A-4, and further presented in elements 302-326 and described below in the following actions, steps, or processes described in the flow chart 300. The elements, actions, or steps listed in FIG. 5 can be performed in the order or sequence shown, but need not be. Fewer elements as well as the order or sequence of the various elements included in flow 300 can be modified without departing from the spirit and scope of the present disclosure.

Element 302 represents plating conductive interconnects 128 on semiconductor device wafer 110, as shown in FIG. 2C. Element 304 represents thinning the wafer 110 to a finished silicon thickness, as shown in FIG. 2C. Element 306 represents singulating semiconductor die 114, as shown in FIG. 2D. Element 308 represents placing the semiconductor die 114 face up on the temporary carrier 136 with compliant adhesive 138, and pressing the semiconductor die 114 into the adhesive material 138, as shown in FIG. 3A. Element 310 represents molding the semiconductor die 114 with the encapsulant or molding material 142 to form the embedded die panel or plastic panel 158, as shown in FIGS. 3C-3E. Element 312 represents removing the carrier 136 to expose backsides 118 of the molded semiconductor die 114, as shown in FIGS. 3E-3I. Element 314 represents grinding the front side 164 of the panel 158 to expose the conductive interconnects 128, as shown in FIG. 3E. Element 316 represents scanning the panel 156 to measure the position and the orientation of each die 114, as shown in FIG. 3E. Element 318 represents applying a high density, multi-layer RDL routing pattern 170 using unit specific patterning or Adaptive Patterning™ to align the RDL pattern 170 to each semiconductor die 114, such as 114a and 114b, as shown in FIG. 3E. Element 320 represents plating flip-chip bumps over the routing 170, as shown in FIG. 3G. Element 322 represents singulating the panel 158 into core units 200, as shown in FIG. 3G. Element 324 represents testing individual fully molded core units 200. Element 326 represents assembling fully molded core units 200 onto the multi-layer substrate 210 using a flip-chip interconnect, as shown in FIG. 3I.

In the foregoing specification, various embodiments of the disclosure have been described. It will, however, be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A method of making a fully molded fan-out module (FMFOM), comprising:
    providing a temporary carrier comprising an adhesive disposed over a top surface of the temporary carrier;
    providing a first semiconductor die comprising conductive interconnects coupled to an active surface of the first semiconductor die;
    providing a second semiconductor die comprising conductive interconnects coupled to an active surface of the second semiconductor die;
    mounting the first semiconductor die and the second semiconductor die face up to the temporary carrier such that back surfaces of the first semiconductor die and the second semiconductor die are depressed within the adhesive before encapsulating the first semiconductor die and the second semiconductor die;
    forming an embedded die panel in a single step by encapsulating at least four side surfaces and the active surface of the first semiconductor die, the second semiconductor die, and further encapsulating at least two side surfaces of each of the conductive interconnects of the first semiconductor die and the second semiconductor die with encapsulant;
    interconnecting the conductive interconnects of the first semiconductor die and the second semiconductor die without a silicon interposer by forming a fine-pitch build-up interconnect structure over the embedded die panel to form at least one molded core unit;
    removing the temporary carrier;
    mounting the at least one molded core unit to an organic multi-layer substrate; and
    coupling a heat sink to the molded core unit with a thermal interface material (TIM) disposed between the heat sink and the molded core unit.

2. The method of claim 1, further comprising removing the first semiconductor die and the second semiconductor die from the adhesive after encapsulating the first semiconductor die and the second semiconductor die to expose the back surfaces of the first semiconductor die and the second semiconductor die, wherein the back surfaces of the first semiconductor die and the second semiconductor die are offset from the encapsulant by a distance greater than 10 µm.

3. The method of claim 2, further comprising:
    providing the TIM over the offset back surfaces of the first semiconductor die and the second semiconductor die; and
    coupling the heat sink to the molded core unit with the TIM disposed between the heat sink and the molded core unit.

4. The method of claim 1, wherein the conductive interconnects are formed as copper studs and further comprise a height of 10-100 µm, and are solder free.

5. The method of claim 1, wherein the fine-pitch build-up interconnect structure directly contacts the conductive interconnects.

6. The method of claim 1, wherein the fine-pitch build-up interconnect structure comprises line and space distance of less than 3 µm.

7. The method of claim 1, further comprising testing electrical connectivity of the at least one molded core unit before mounting the at least one molded core unit to the organic multi-layer substrate.

8. A method of making a fully molded fan-out module (FMFOM), comprising:
    providing a temporary carrier comprising an adhesive disposed over a top surface of the temporary carrier;
    mounting a first semiconductor die and a second semiconductor die face up to the temporary carrier such that back surfaces of the first semiconductor die and the second semiconductor die are depressed within the adhesive before encapsulating the first semiconductor die and the second semiconductor die;
    forming an embedded die panel by encapsulating at least four side surfaces and an active surface of the first semiconductor die, the second semiconductor die, and a side surface of each of a plurality of conductive interconnects coupled to the first and second semiconductor die in a single step;
    interconnecting the conductive interconnects of the first semiconductor die and the second semiconductor die without a silicon interposer by forming a fine-pitch build-up interconnect structure over the embedded die panel to form at least one molded core unit;
    removing the temporary carrier; and
    mounting the at least one molded core unit to a multi-layer substrate.

9. The method of claim 8, further comprising:
    mounting the first semiconductor die and the second semiconductor die face up to the carrier before encapsulating the first semiconductor die and the second semiconductor die; and
    removing the first semiconductor die and the second semiconductor die from the carrier after encapsulating the first semiconductor die and the second semiconductor die to expose the back surfaces of the first semiconductor die and the second semiconductor die, wherein the back surfaces of the first semiconductor die and the second semiconductor die are offset from the encapsulant by a distance greater than 10 µm.

10. The method of claim 9, further comprising:
    providing a thermal interface material (TIM) over the offset back surfaces of the first semiconductor die and the second semiconductor die; and coupling a heat sink to the molded core unit with the TIM disposed between the heat sink and the molded core unit.

11. The method of claim 8, wherein the fine-pitch build-up interconnect structure directly contacts the conductive interconnects.

12. The method of claim 8, wherein the fine-pitch build-up interconnect structure comprises line and space distance of less than 3 µm.

13. The method of claim 8, further comprising forming the multi-layer substrate as a high density build-up (HDBU) substrate wherein the coefficient of thermal expansion (CTE) of the molded core unit is within 40% of the CTE of the HDBU substrate.

14. The method of claim 8, further comprising planarizing the embedded die panel to provide a coplanarity of less than or equal to 10 µm onto which the fine-pitch build-up interconnect structure is formed.

15. A method of making a fully molded fan-out module (FMFOM), comprising:
   providing a first semiconductor die and second semiconductor die with conductive interconnects;
   forming an embedded die panel by encapsulating at least four sides surfaces and an active surface of the first semiconductor die, the second semiconductor die, and at least two side surfaces of each of the conductive interconnects in a single step;
   interconnecting the conductive interconnects of the first semiconductor die and the second semiconductor die without a silicon interposer by forming a fine-pitch build-up interconnect structure over the embedded die panel to form at least one molded core unit; and
   mounting the at least one molded core unit to a multi-layer substrate.

16. The method of claim 15, further comprising:
   providing a temporary carrier comprising an adhesive disposed over a top surface of the temporary carrier;
   mounting the first semiconductor die and the second semiconductor die face up to the temporary carrier such that back surfaces of the first semiconductor die and the second semiconductor die are depressed within the adhesive before encapsulating the first semiconductor die and the second semiconductor die; and
   removing the first semiconductor die and the second semiconductor die from the carrier after encapsulating the first semiconductor die and the second semiconductor die to expose the back surfaces of the first semiconductor die and the second semiconductor die, wherein the back surfaces of the first semiconductor die and the second semiconductor die are offset from the encapsulant by a distance greater than 10 µm.

17. The method of claim 16, further comprising:
   providing a thermal interface material (TIM) over the offset back surfaces of the first semiconductor die and the second semiconductor die; and
   coupling a heat sink to the molded core unit with the TIM disposed between the heat sink and the molded core unit.

18. The method of claim 15, further comprising testing electrical connectivity of the at least one molded core unit before mounting the at least one molded core unit to the multi-layer substrate.

19. The method of claim 15, further comprising:
   forming the multi-layer substrate as a high density build-up (HDBU) substrate; and
   mounting the molded core unit to the HDBU substrate with flip-chip bumps comprising bump coplanarity of less than or equal to 15 microns.

20. The method of claim 15, further comprising singulating the embedded die panel after forming the fine-pitch build-up interconnect structure to form a plurality of molded core units that includes the at least one molded core unit.

* * * * *